US005734125A

United States Patent [19]

Yasukuni et al.

[11] Patent Number: 5,734,125

[45] Date of Patent: Mar. 31, 1998

[54] JUNCTION BOX

[75] Inventors: Jun Yasukuni; Shigeto Kawamura, both of Yokkaichi, Japan

[73] Assignee: Sumitomo Wiring Systems, Ltd., Japan

[21] Appl. No.: 584,489

[22] Filed: Jan. 11, 1996

[30] Foreign Application Priority Data

| | | | |
|---|---|---|---|
| Jan. 10, 1995 | [JP] | Japan | 7-001973 |
| Feb. 8, 1995 | [JP] | Japan | 7-020484 |

[51] Int. Cl.[6] .......... H01L 23/28

[52] U.S. Cl. .......... 174/52.2; 174/59; 174/68.2

[58] Field of Search .......... 174/59, 52.2, 68.2; 439/936, 949, 212, 76.2, 723, 724

[56] References Cited

U.S. PATENT DOCUMENTS

| | | | |
|---|---|---|---|
| 2,930,904 | 3/1960 | Fritts | 174/52.2 X |
| 3,488,621 | 1/1970 | Stevens | 174/68.2 X |
| 3,778,685 | 12/1973 | Kennedy | 174/52.2 X |
| 4,336,749 | 6/1982 | Barnhart et al. | 98/43 R |
| 4,781,600 | 11/1988 | Sugiyama et al. | 439/45 |
| 4,873,600 | 10/1989 | Vogele | 361/426 |
| 4,952,342 | 8/1990 | Drain et al. | 264/22 |
| 4,961,106 | 10/1990 | Butt et al. | 357/74 |
| 5,011,417 | 4/1991 | Matsumoto et al. | 439/76.2 |
| 5,013,161 | 5/1991 | Zaragoza et al. | 374/208 |
| 5,208,733 | 5/1993 | Besanger | 361/386 |
| 5,323,150 | 6/1994 | Tuttle | 174/52.2 X |

FOREIGN PATENT DOCUMENTS 63-7126 1/1988 Japan .

OTHER PUBLICATIONS

"Designing Potted Circuits," by Frank J. Davidson, Electronic Design, Mar. 1955, pp. 38 and 39.

*Primary Examiner*—Kristine L. Kincaid
*Assistant Examiner*—Dean A. Reichard
*Attorney, Agent, or Firm*—Anthony J. Casella; Gerald E. Hespos; Ludomir A. Budzyn

[57] ABSTRACT

The invention is designed to improve a radiation effect of a junction box so as to eliminate a limit in a current to be applied to busbars. A filler 15 of epoxy resin is injected into the interior of coupled lower and upper casings 1 and 3 through injection holes formed in suitable positions of the casings 1 and 3 so as to fill the interior with the filler 15. Since air layers within the coupled casings 1 and 3 can be eliminated by the filler 15, heat generated due to application of a current to busbars 11 can be efficiently radiated via the filler 15 and the casings 1 and 3, thereby improving a radiation effect within the junction box. Therefore, it is not necessary to limit a current applied to the busbars, and a relatively large current can be applied to the busbars.

10 Claims, 7 Drawing Sheets

JUNCTION BOX

BACKGROUND OF THE INVENTION

1. Field of the Invention.

The present invention relates to a junction box for connecting wiring harnesses which box includes a main body and a plurality of busbars accommodated in the main body.

2. Description of the Prior Art.

A known junction box for connecting wiring harnesses includes, for example, a lower casing 1, a plurality of intermediate terminals 2 formed by bending busbars and an upper casing 3 as shown in FIGS. 4 to 6. The upper casing 3 is coupled with the lower casing 1 such that the respective intermediate terminals 2 are accommodated therein. The upper and lower casings 3 and 1 are lockingly coupled by the engagement of locking means provided at the sides thereof.

The lower casing 1 shown in FIG. 4 is made of resin, in particular polyethylene (PE) or polypropylene (PP) or the like materials and is formed, on its lower surface, with a plurality of connector receptacles 5 for accommodating unillustrated connectors mounted at the ends of wiring harnesses. The upper casing 3 shown in FIG. 6 is also made of resin such as PP and is formed, on its upper surface, with a plurality of fuse sockets 7 for accommodating fuses 6, a plurality of relay sockets 9 for accommodating relays 8, and a plurality of connector receptacles 10 for accommodating unillustrated connectors mounted at the ends of the wiring harnesses. Further, the respective intermediate terminals 2 shown in FIG. 5 are formed as follows. As shown in detail in FIGS. 7 and 8, busbars 11 of copper are mounted on base plates 12 of an insulating material, and bent portions of the busbars 11 project from through holes formed in specified positions of the base plates 12, thereby forming the intermediate terminals 2. A plurality of layers of the busbars 11 and the base plates 12 arranged within the coupled lower and upper casings 1 and 3 and are held in a spaced manner by inwardly projecting portions 13.

However, the known junction box has the disadvantage that due to the generation of heat by ohmic resistance, the current to be applied to the busbars 11 has to be limited in order to assure a reliable function of the junction box, in particular a reliable electric connection e.g. between the junction box and a terminal, fuse, wire harness or the like.

Therefore, it is an object of the present invention to provide an improved junction box, for which a current to be applied to busbars is not limited.

SUMMARY OF THE INVENTION

This object is solved according to the invention by a junction box for connecting wiring harnesses, comprising: a main body, and one or more busbars accommodated within the coupled main body, wherein a space arranged between the main body and the busbar is filled with a filler material and/or wherein a material of the main body comprises an additive material having a high thermal conductivity and an electrical insulation property.

According to a preferred embodiment, the filler material is a resin.

Preferably, the filler material comprises injected filler material injected into the interior of main body, in particular through injection holes formed therein.

Further, the filler material preferably comprises molded filler material placed in the main body in a molded state.

Further, the filler material preferably is filled when the busbars are arranged by means of insert molding.

According to a further preferred embodiment, the material of the main body is either polyethylene or polypropylene.

According to still a further embodiment, the additive material is one or more of silicone dioxide, aluminium oxide, magnesium oxide, boron nitride and beryllium oxide.

Preferably, the main body comprises a lower casing and an upper casing to be coupled with the lower casing.

According to a further preferred embodiment, the main body comprises polyethylene (PE) or polypropylene (PP) and wherein a weight proportion of polypropylene (PP) or polyethylene (PE) to the thermally conductive material is between about 0.8 and about 0.95, preferably about 0.9.

According to a still further preferred embodiment, the main body comprises polypropylene (PP) and talc and wherein a weight proportion of polypropylene (PP) and talc to the thermally conductive material is between about 1.1 and about 1.3, preferably about 1.23.

According to a further preferred embodiment, if the strength of the main body or casing is high, the main body can be made thinner, wherein the specific gravity of the material should be preferably less than 2.0. The specific gravity being defined as the ratio of density of a material to the density of a standard material such as water at a specified temperature of e.g. 4° C. (40° F.).

According to a preferred embodiment of the invention, there is provided a junction box for connecting wiring harnesses, comprising a lower casing, an upper casing to be coupled with the lower casing, and a plurality of busbars accommodated within the coupled lower and upper casings, wherein the interior of the coupled casings is filled with a filler.

Accordingly, since air layers within the coupled casings are eliminated by the filler, heat generated due to application of a current to the busbars can be efficiently radiated via the filler and the casings. As a result, a radiation performance of the junction box is improved and it is not necessary to limit a current to be applied to the busbars as in the prior art junction box.

As described above, the interior of the coupled lower and upper casings is filled with the filler to eliminate the air layer within the casings. Since heat can be efficiently radiated via the filler and the casings, the radiation effect within the junction box can be improved. Therefore, it is not necessary to limit a current applied to the busbars as in the prior art, and a larger current can be applied to the busbars in the inventive junction box than in the prior art junction box. As a result, the junction box can be designed with an enhanced degree of freedom.

According to a further preferred embodiment, there is provided a junction box for connecting wiring harnesses, comprising a lower casing, an upper casing to be coupled with the lower casing, and a plurality of busbars accommodated within the coupled lower and upper casings, wherein a material of the casings is provided with an additive having a higher thermal conductivity than the material of the casings and an electrical insulation property.

Accordingly, because of the use of the additive having a higher thermal conductivity than the material of the lower and upper casings and an electrical insulation property, the radiation performance of the junction box can be improved, thereby obviating the need to limit a current to be applied to the busbars.

As described above, since the material of the lower and upper casings is provided with the additive having a higher thermal conductivity than the material of the casings and an electrical insulation property, the radiation performance of the junction box can be improved. Therefore, it is not necessary to limit a current applied to the busbars as in the prior art, and a larger current can be applied to the busbars in the inventive junction box than the prior art junction box. As a result, the junction box can be designed with an enhanced degree of freedom.

BRIEF DESCRIPTION OF THE DRAWINGS

These and other objects, features and advantages of the present invention will become more apparent upon a reading of the following detailed description and accompanying drawings in which.

DETAILED DESCRIPTION OF THE PREFERRED EMBODIMENT

Figure 1:
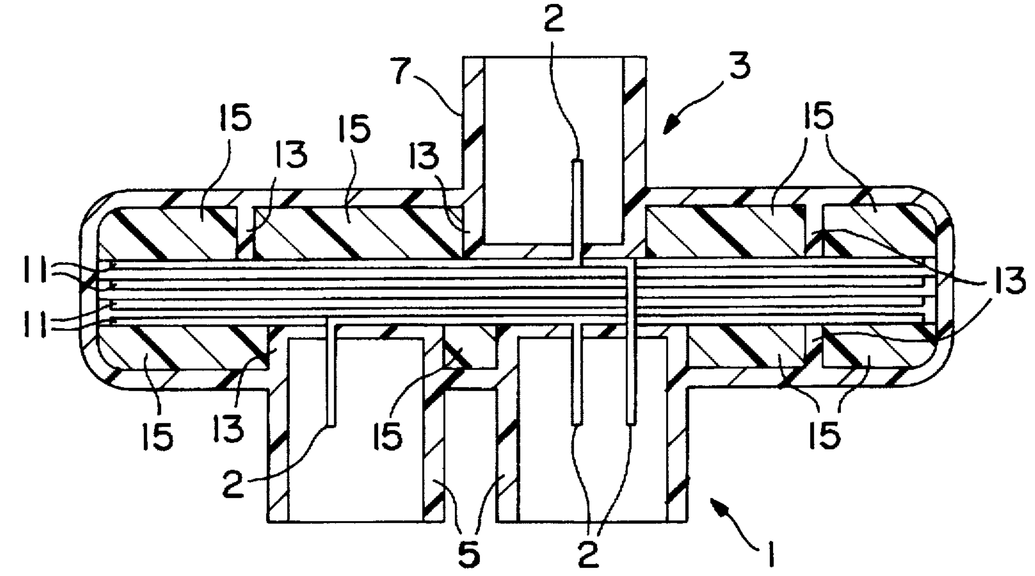
FIG. 1 is a section of an embodiment according to the invention.
Figure 7:
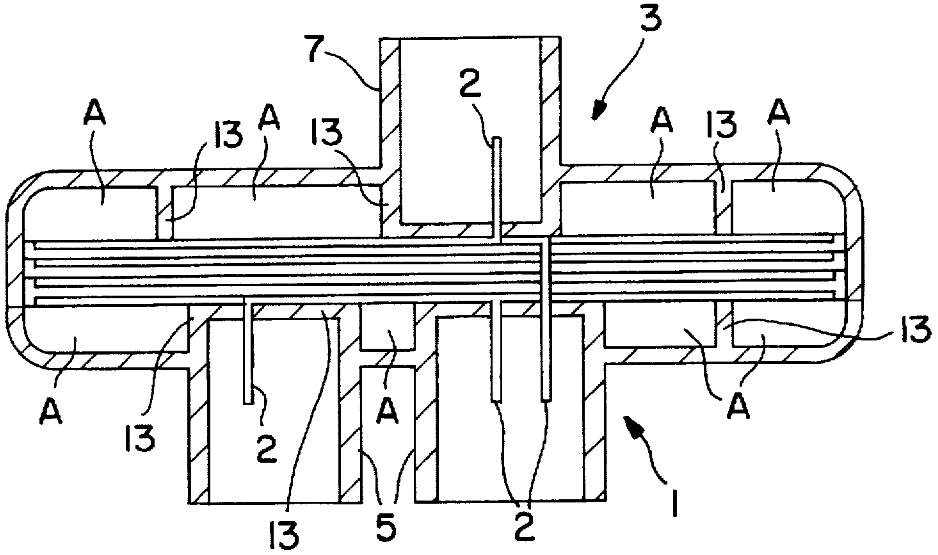
FIG. 7 PRIOR ART
FIG. 7 is a section of the prior art junction box.
Figure 8:
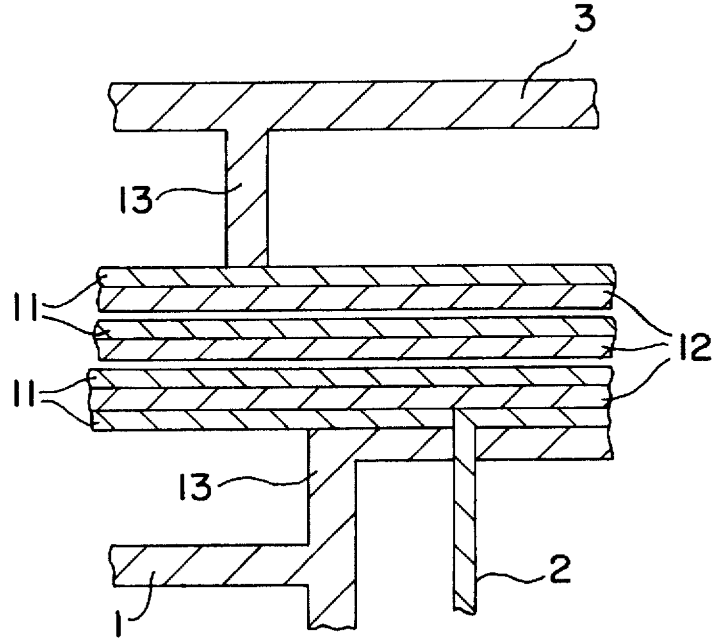
FIG. 8 PRIOR ART
FIG. 8 is an enlarged section partially showing the prior art junction box.

In FIG. 1, elements similar or corresponding to those in FIG. 7 are identified by the same reference numerals. FIG. 1 differs from FIG. 7 in that a filler 15 of epoxy resin is injected into the interior of the coupled lower and upper casings 1 and 3 through injection holes formed in suitable positions of the casings 1 and 3 so as to fill the interior.

Figure 2A:
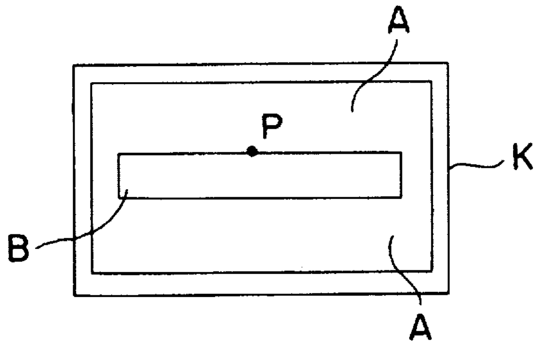
FIG. 2 is a diagram showing the operation of the embodiment.
Figure 2B:
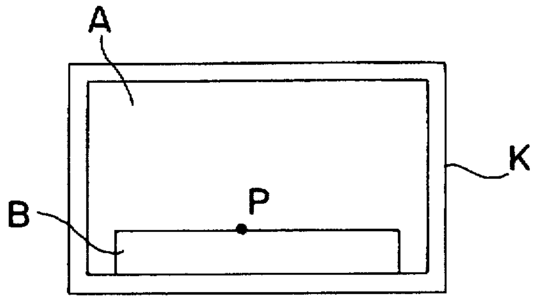
Figure 2C:
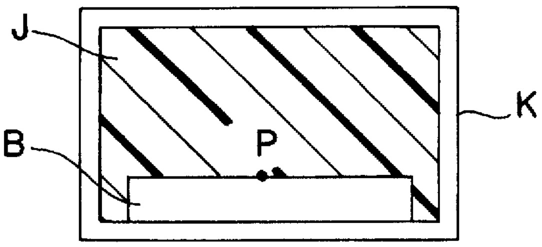

In order to examine a heat radiation effect of the filler 15, a current of a given value was applied to a busbar B provided within a substantially sealed resin casing K as diagrammatically shown in FIG. 2(views a to c), and temperature was measured at point P on the surface of the busbar B. The temperature at point P was highest when air layers or volumes A exist below and above the busbar B within the casing K as shown in FIG. 2(view a); was second highest when the busbar B was in contact with the inner surface of the casing K as shown in FIG. 2(view b); and was lowest when the interior of the casing K was filled with a filler J such as an epoxy resin as shown in FIG. 2(view c).

The temperature was highest in the case shown in FIG. 2(view a) because the heat was kept because of the insulation effect of the air layers A below and above the busbar B. The temperature was lower in the case shown in FIG. 2 (view b) than in the case shown in FIG. 2(view a) because heat was radiated via the casing K since the busbar B was in contact with the casing K although the air layer A existed. The temperature was lowest in the case shown in FIG. 2(view c) because heat was efficiently radiated via the filler J and the casing K.

The air layers A within the coupled casings 1 and 3 can be eliminated by injecting the filler 15 into the interior of the casings 1 and 3. Accordingly, the heat generated due to application of a current to the busbars 11 can be efficiently radiated via the filler 15 and the casings 1 and 3, thereby improving a heat radiation effect of the junction box. Therefore, it is not necessary to limit a current applied to the busbars 11 as in the prior art, and a larger current can be applied to the busbars 11 in the inventive junction box than the prior art junction box.

Another embodiment of the invention may be such that the filler 15 is filled when the busbars 11 are arranged by means of insert molding, i.e. molding by arranging an insert in a resin, plastic or the like. This embodiment has the same effect as the embodiment shown in FIG. 1.

Although an epoxy resin is used as the filler 15 in the foregoing embodiment, a material for the filler 15 is not particularly limited to this. Any material with a suitable thermal conductivity and suitable electric insulation properties may be employed.

Figure 4:
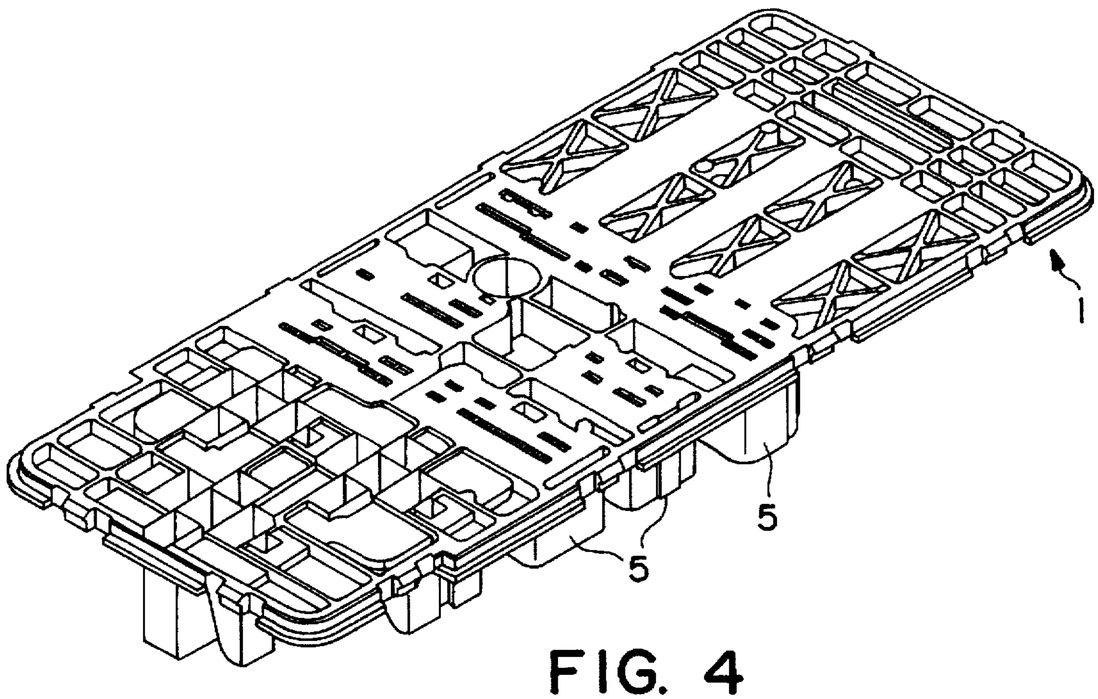
FIG. 4 PRIOR ART
FIG. 4 is a perspective view of one part of a prior art junction box.
Figure 5:
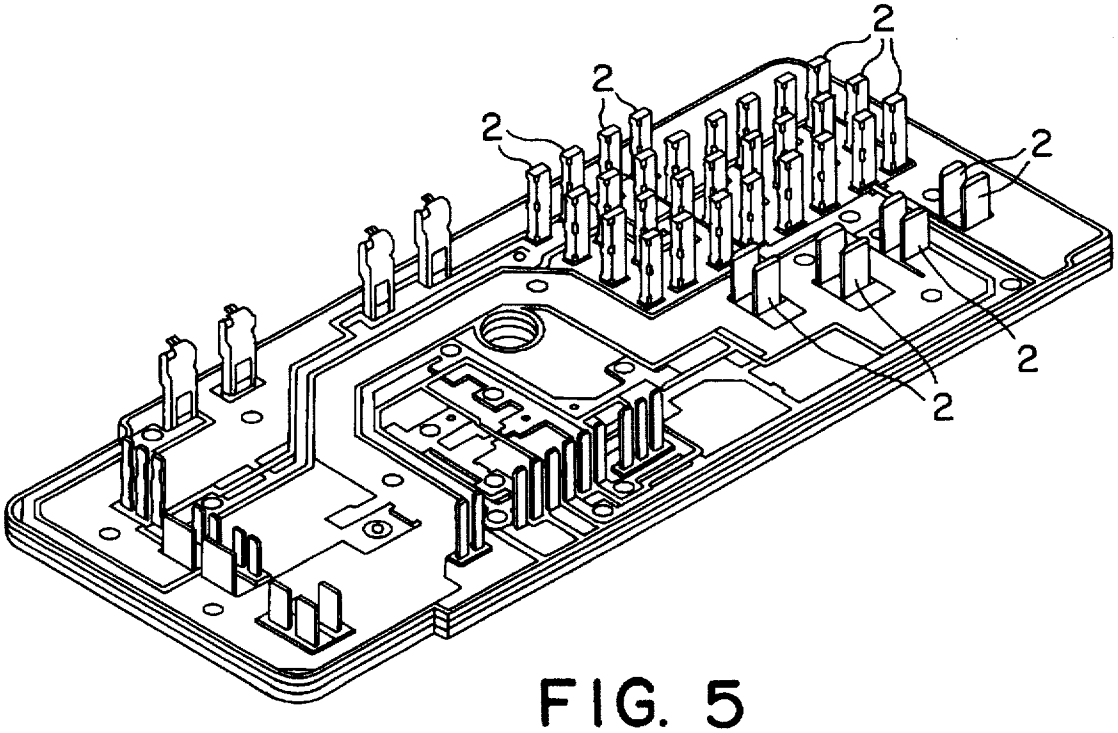
FIG. 5 PRIOR ART
FIG. 5 is a perspective view of another part of the prior art junction box.
Figure 6:
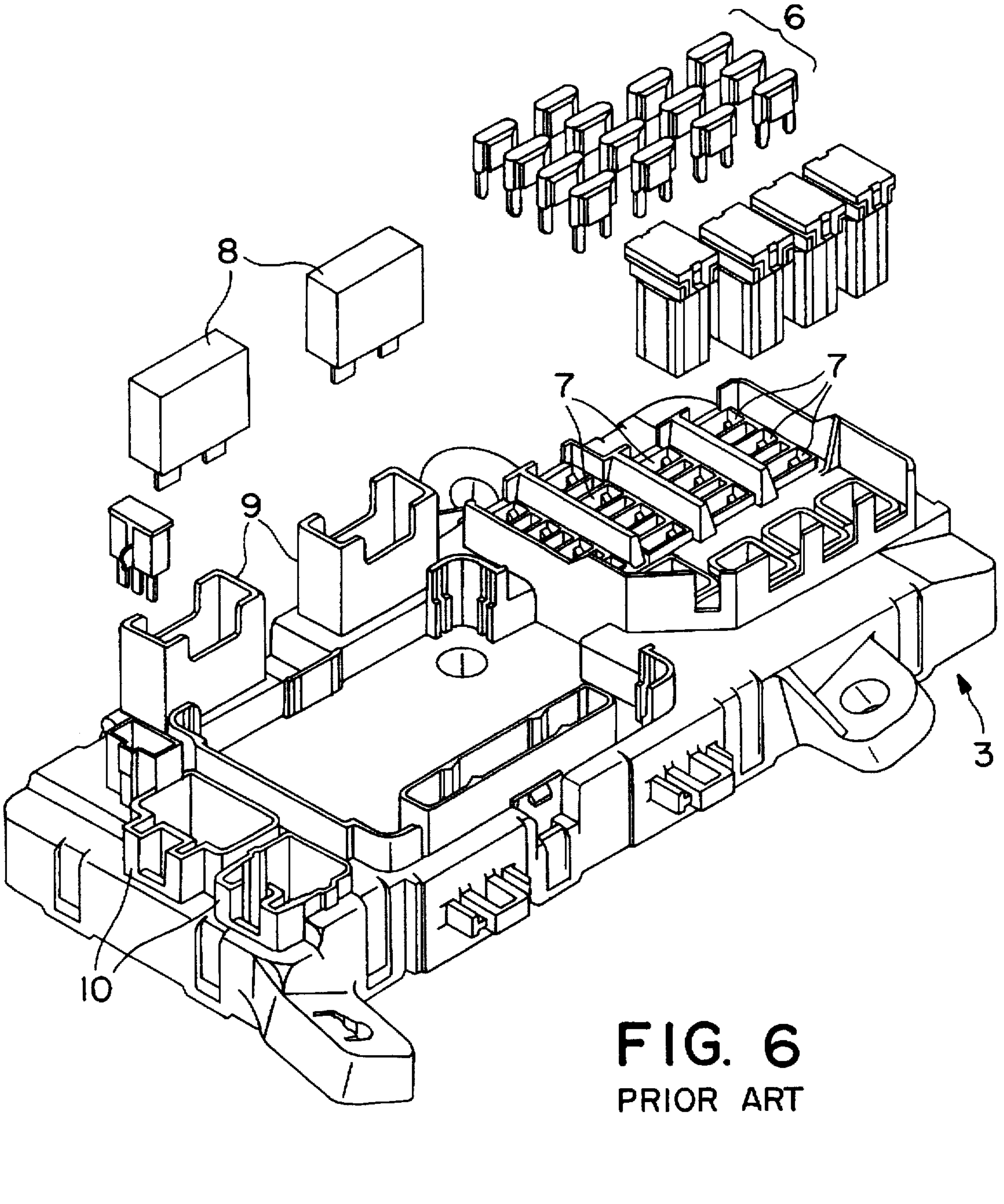
FIG. 6 PRIOR ART
FIG. 6 is a partial perspective view of still another part of the prior art junction box.

Since the external construction of the embodiment is the same as the prior art junction box, the following description is made with reference to FIGS. 4, 6 and 7.

In the case where the material of the lower casing 1 shown in FIGS. 4 and 7 and the upper casing shown in FIGS. 6 and 7 is PE or PP as described above, silicone dioxide (silica), aluminium oxide (alumina), magnesium oxide (magnesia), boron nitride or beryllium oxide is added to the PE or PP as an additive having a higher thermal conductivity than PE and PP and an electrical insulation property.

The thermal conductivities of PE and PP are $5.5\times10^{-4}$ and $2.8\times10^{-4}$ cal/(cm·s·deg) ($5.5\times10^{-2}$ and $2.8\times10^{-2}$ W/(cm·K)), respectively. On the other hand, the thermal conductivities of silicone dioxide, aluminium oxide, magnesium oxide, boron nitride and beryllium oxide are $3.7\times10^{-3}$, $7.0\times10^{-2}$, $8.6\times10^{-2}$, $1.5\times10^{-1}$ and $5.6\times10^{-1}$ cal/cm·s·deg ($3.7\times10^{-1}$, 7.0, 8.6, 15 and 56 W/(cm·K)), respectively. Any of the above substances has a higher thermal conductivity than PE and PP and a good electrical insulation property.

Figure 3:
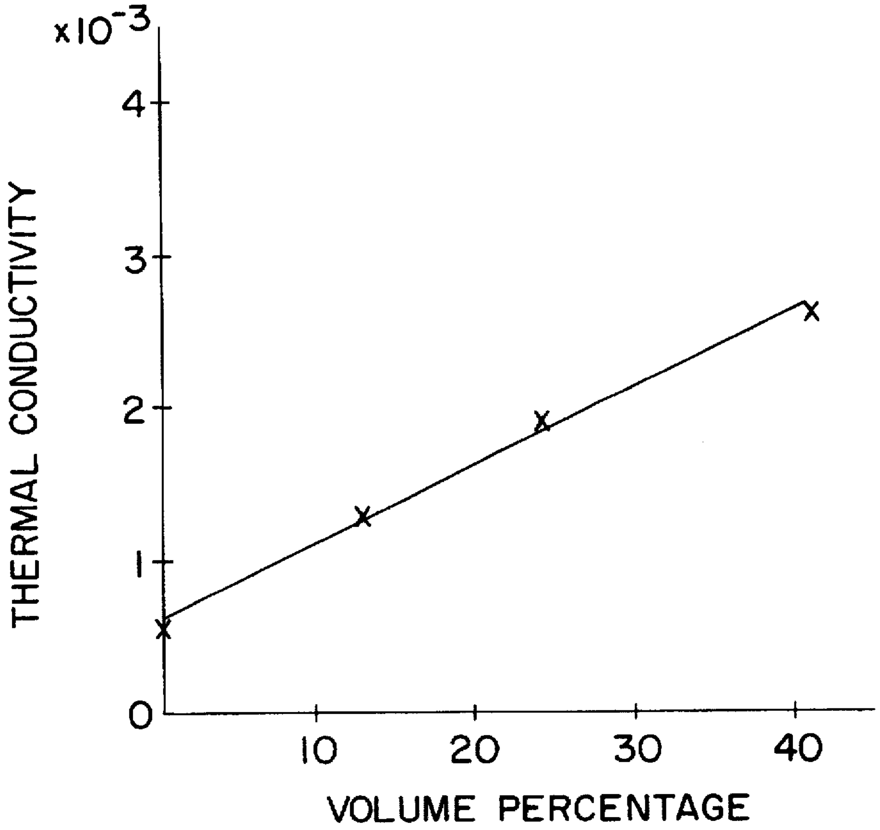
FIG. 3 is a graph explaining a further embodiment of the invention.

In order to obtain a relationship between the quantity of the additive and the thermal conductivity, the following measurement was conducted. Aluminium oxide as an additive was added to PE as a base resin corresponding to the material of the casings 1 and 3, and a variation in the thermal conductivity accompanied by a variation in the quantity (volume percentage) of aluminium oxide was measured. The measurement result is as shown in FIG. 3. This result shows that the thermal conductivity improves as the quantity of the additive increases. However, it is desired to set an optimal quantity of the additive in view of workability of the casings 1 and 3 and other factors.

Because of the use of silicone dioxide, aluminium oxide, magnesium oxide, boron nitride or beryllium oxide as the additive having a higher thermal conductivity than PE or PP as the material of the casings 1 and 3 and an electrical insulation property, the radiation performance of the junction box is improved, thereby obviating the need to limit a current to be applied to the busbars.

The additive to be added to the material of the lower and upper casings 1 and 3 is not limited to the aforementioned silicone dioxide, aluminium oxide, magnesium oxide, boron nitride and beryllium oxide.

It should be also appreciated that the material of the lower and upper casings 1 and 3 is not limited to PE and PP.

What is claimed is:

1. A junction box for connecting wiring harnesses, comprising:

a main body (1,3) formed from a material comprising polypropylene with an additive material having a thermal conductivity higher than the polypropylene, such that a weight proportion of the polypropylene to the thermally conductive additive material is between about 0.8 and about 0.95, said material of the main body further comprising talc such that a weight proportion of the polypropylene and talc to the thermally conductive additive material is between about 1.1 and about 1.3, said main body (1,3) defining a substantially enclosed space therein, at least one busbar (11,B) within the space of the main body (1,3), and a filler material (15) filling substantially all portions of the space between the main body (1,3) and the at least one busbar (11,B), the filler material (15) having a thermal conductivity higher than air and having an electrical insulation property.

2. A junction box according to claim 1, wherein the filler material (15) is a resin.

3. A junction box according to claim 1, wherein the filler material (15) comprises injected filler material injected into the space of the main body (1,3) through injection holes formed therein.

4. A junction box according to claim 1, wherein the filler material (15) comprises molded filler material placed in the main body (1,3) in a molded state.

5. A junction box according to claim 1, wherein the filler material (15) is filled around the at least one busbar by means of insert molding.

6. A junction box according to claim 1, wherein the additive material is selected from the group consisting of silicone dioxide, aluminium oxide, magnesium oxide, boron nitride and beryllium oxide.

7. A junction box according to claim 1, wherein the main body comprises a lower casing (1) and an upper casing (3) coupled with the lower casing (1).

8. A junction box according to claim 1, wherein the weight proportion of the polypropylene to the thermally conductive additive material is about 0.9.

9. A junction box according to claim 1, wherein the weight proportion of the polypropylene (PP) and the talc to the thermally conductive material is about 1.23.

10. A junction box according to claim 1, wherein the specific gravity of the material of the main body is less than about 2.0.

* * * * *